United States Patent
Brusic et al.

[11] Patent Number: 5,960,251
[45] Date of Patent: *Sep. 28, 1999

[54] ORGANIC-METALLIC COMPOSITE COATING FOR COPPER SURFACE PROTECTION

[75] Inventors: Vista A. Brusic, Geneva, Ill.; Vijay S. Darekar, Temple, Tex.; Michael A. Gaynes, Vestal; Ravi F. Saraf, Briarcliff Manor, both of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/768,830

[22] Filed: Dec. 18, 1996

Related U.S. Application Data

[60] Provisional application No. 60/015,568, Apr. 18, 1996.

[51] Int. Cl.$^6$ .............................. B22F 1/00; B05D 1/36; B05D 3/00; B05D 7/14
[52] U.S. Cl. .................. 428/551; 106/14.17; 106/14.42; 106/14.44; 228/205; 228/207; 228/208; 228/209; 228/262.61; 427/96; 427/203; 427/205; 427/353; 427/328; 427/384; 427/405; 427/419.8; 428/901; 428/548; 428/553
[58] Field of Search ............................. 427/126.5, 126.6, 427/125, 96, 98, 383.7, 388.1, 388.4, 353, 384, 405, 419.8, 203, 205, 327, 328, 307; 106/1.11, 1.26, 14.17, 14.44, 14.42; 428/548, 551, 553, 546, 901; 228/205, 207, 208, 209, 262.61

[56] References Cited

U.S. PATENT DOCUMENTS

| | | | |
|---|---|---|---|
| 3,581,159 | 5/1971 | Piper et al. | 317/230 |
| 3,660,087 | 5/1972 | Kaspaul et al. | 96/1.8 |
| 3,801,880 | 4/1974 | Harada et al. | 317/234 R |
| 3,856,560 | 12/1974 | Blackwell | 117/132 B |
| 3,865,593 | 2/1975 | Yoshida | 96/77 |
| 3,907,621 | 9/1975 | Polichette et al. | 156/18 |
| 3,930,963 | 1/1976 | Polichette et al. | 204/15 |
| 3,933,531 | 1/1976 | Sawa et al. | 106/14 |
| 3,963,419 | 6/1976 | Ware | 8/142 |
| 4,049,844 | 9/1977 | Bolon et al. | 427/217 |
| 4,093,768 | 6/1978 | Cordts et al. | 428/287 |
| 4,122,143 | 10/1978 | Momotari et al. | 264/104 |
| 4,131,699 | 12/1978 | Feldstein | 427/306 |
| 4,197,124 | 4/1980 | Ikeda et al. | 430/302 |
| 4,248,921 | 2/1981 | Steigerwald et al. | 427/123 |
| 4,290,195 | 9/1981 | Rippere | 29/837 |
| 4,312,896 | 1/1982 | Armstrong | 427/96 |
| 4,353,954 | 10/1982 | Yamaoka et al. | 428/216 |
| 4,393,120 | 7/1983 | Watai et al. | 428/457 |
| 4,395,294 | 7/1983 | Hobbins et al. | 148/6.14 R |
| 4,404,237 | 9/1983 | Eichelberger et al. | 427/98 |

(List continued on next page.)

FOREIGN PATENT DOCUMENTS

| | | |
|---|---|---|
| 0 595 343 | 5/1994 | European Pat. Off. |
| 7-94853 | 4/1995 | Japan . |

OTHER PUBLICATIONS

Derwent AN 95–174002, Abstract of 7–94853 (Japan, Ref AM, above) Apr., 1995.
Derwent AN 94–061748, Jan. 1994.
Derwent AN 93–049297, Jan. 1993.
Derwent AN 93–261844, Jul. 1993.
Derwent AN 84–247502, Aug. 1984.

*Primary Examiner*—Diana Dudash
*Attorney, Agent, or Firm*—Michael N. Meller; Eugene Lieberstein

[57] ABSTRACT

Copper-containing surfaces of substrates such as laminated electronic circuit boards are protected by organometallic coatings comprising organic compounds selected from the group consisting of benzimidazoles, alkylimidazoles, benzotriazozles and alkyltriazoles, substituted or unsubstituted, and metal particles of solder-wettable metals or metal solders. The metal particles can be thermally formed in situ from metallic compounds such as noble metal acetates, acetylacetonates and carbonates.

15 Claims, 4 Drawing Sheets

U.S. PATENT DOCUMENTS

| | | | |
|---|---|---|---|
| 4,426,546 | 1/1984 | Hotta et al. | 136/256 |
| 4,428,987 | 1/1984 | Bell et al. | 427/327 |
| 4,526,806 | 7/1985 | Haque et al. | 427/41 |
| 4,552,885 | 11/1985 | Gabrieee et al. | 514/316 |
| 4,595,605 | 6/1986 | Martin et al. | 427/96 |
| 4,595,606 | 6/1986 | St. John et al. | 427/96 |
| 4,598,022 | 7/1986 | Haque et al. | 428/413 |
| 4,612,049 | 9/1986 | Berner et al. | 106/14.13 |
| 4,643,793 | 2/1987 | Nakaso et al. | 156/306.6 |
| 4,683,071 | 7/1987 | Regenass et al. | 252/49.3 |
| 4,693,907 | 9/1987 | Ishikawa et al. | 427/97 |
| 4,707,297 | 11/1987 | Paske, Jr. et al. | 252/301.16 |
| 4,731,128 | 3/1988 | Casullo | 428/470 |
| 4,761,303 | 8/1988 | Ruszczyk et al. | 427/96 |
| 4,775,449 | 10/1988 | Dumas et al. | 204/30 |
| 4,812,363 | 3/1989 | Bell et al. | 428/240 |
| 4,851,322 | 7/1989 | Inagaki et al. | 430/270 |
| 4,873,136 | 10/1989 | Foust et al. | 428/209 |
| 4,892,776 | 1/1990 | Rice | 428/209 |
| 4,902,734 | 2/1990 | Dexter et al. | 524/91 |
| 4,921,550 | 5/1990 | McLellan | 148/24 |
| 4,921,571 | 5/1990 | Kukanskis et al. | 156/656 |
| 4,935,281 | 6/1990 | Tolbert et al. | 428/116 |
| 4,960,236 | 10/1990 | Hedges et al. | 228/180.1 |
| 4,994,317 | 2/1991 | Dugan et al. | 428/246 |
| 5,028,513 | 7/1991 | Murakami et al. | 430/315 |
| 5,028,984 | 7/1991 | Ameen et al. | 357/72 |
| 5,061,566 | 10/1991 | Morgan | 428/423.1 |
| 5,064,723 | 11/1991 | Lawson | 428/457 |
| 5,091,283 | 2/1992 | Tanaka et al. | 430/280 |
| 5,104,734 | 4/1992 | Anschel | 428/336 |
| 5,112,428 | 5/1992 | Correa et al. | 156/324 |
| 5,139,700 | 8/1992 | Miksic et al. | 252/389.54 |
| 5,156,728 | 10/1992 | Yamaguchi et al. | 204/416 |
| 5,165,344 | 11/1992 | Matsumoto et al. | 101/451 |
| 5,167,835 | 12/1992 | Harder | 210/750 |
| 5,173,130 | 12/1992 | Kinoshita et al. | 148/268 |
| 5,178,685 | 1/1993 | Borenstein et al. | 136/244 |
| 5,194,139 | 3/1993 | Kinase et al. | 205/210 |
| 5,215,838 | 6/1993 | Tam et al. | 430/41 |
| 5,219,520 | 6/1993 | Brofman et al. | 419/35 |
| 5,244,539 | 9/1993 | McGrath et al. | 156/656 |
| 5,261,593 | 11/1993 | Casson et al. | 228/180.22 |
| 5,275,694 | 1/1994 | Yamaguchi et al. | 156/656 |
| 5,281,684 | 1/1994 | Moore et l. | 427/96 |
| 5,496,590 | 3/1996 | Maki et al. | 427/388.1 |
| 5,503,698 | 4/1996 | Goldberg et al. | 106/1.26 |
| 5,560,785 | 10/1996 | Hirao et al. | 148/26.9 |
| 5,567,534 | 10/1996 | Yano et al. | 148/269 |

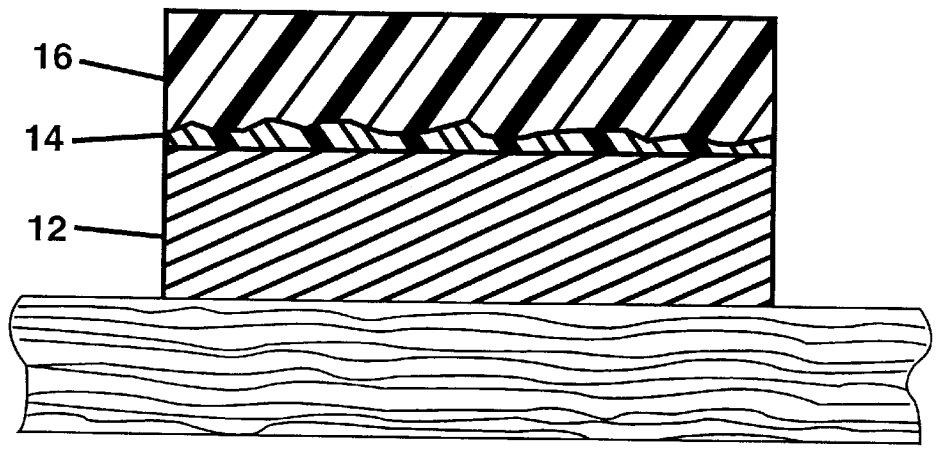
PRIOR ART FIG. 1
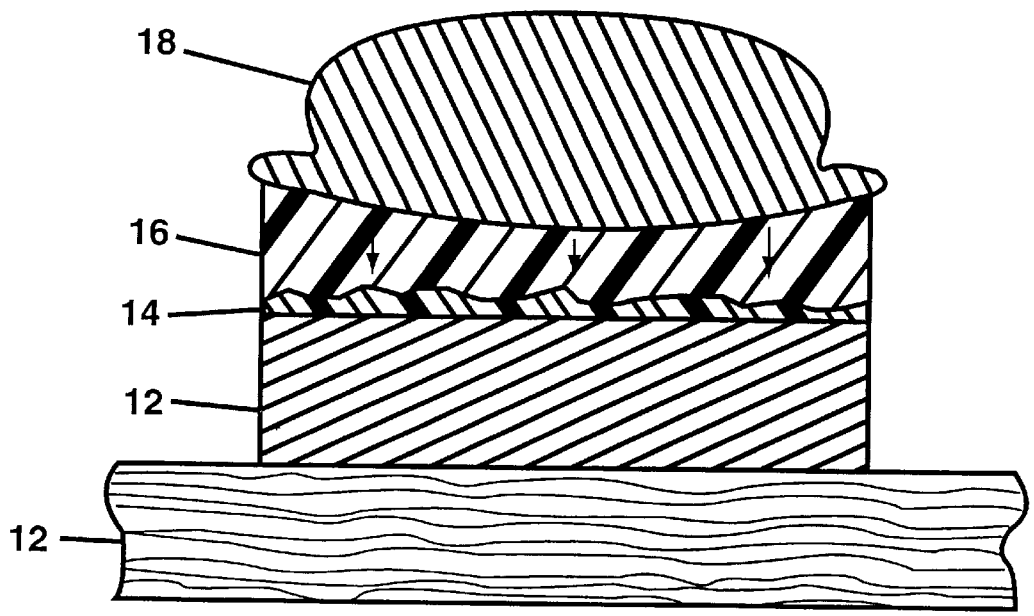
PRIOR ART FIG. 2

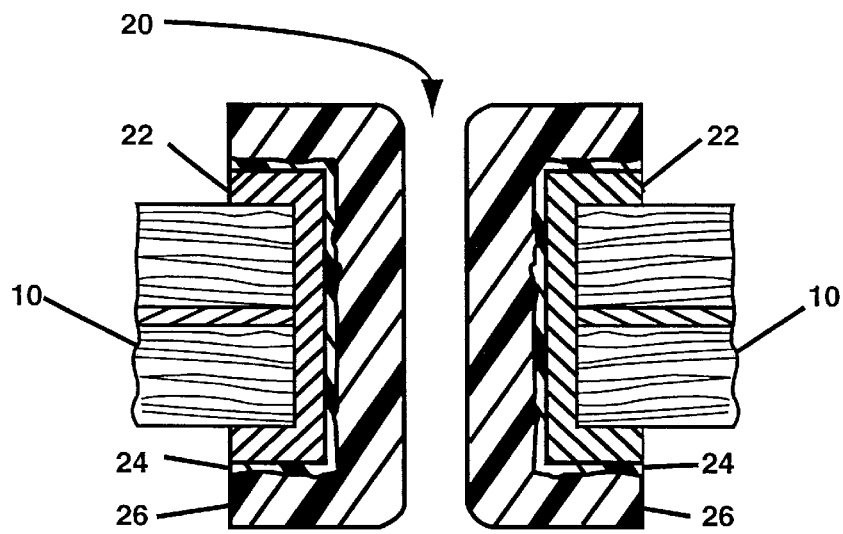
PRIOR ART FIG. 5
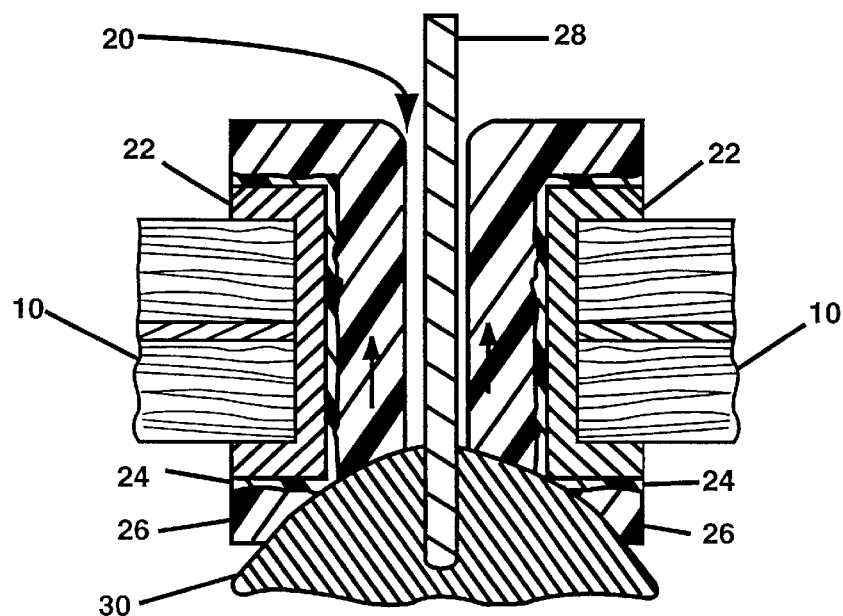
PRIOR ART FIG. 6

ORGANIC-METALLIC COMPOSITE COATING FOR COPPER SURFACE PROTECTION

Priority is claimed based on U.S. provisional application Ser. No. 60/015,568, filed Apr. 18, 1996.

BACKGROUND OF THE INVENTION

1. Field of the Invention

The present invention is concerned with methods for protecting copper-containing surfaces from corrosion, and is especially used for inhibiting corrosion of copper substrates that are to be used in printed circuitry that requires storage over appreciable periods of time prior to attaching other components by soldering. The present invention is also concerned with the protected copper products obtained by the methods of the present invention.

2. Background Art

Copper and its alloys are the most commonly used metals in electronic applications and especially in providing conductive circuit paths for printed circuit boards and printed circuit cards.

Very often it is necessary to store printed circuit boards and cards after their manufacture for substantial periods of time of up to a year or more before circuit elements and devices are inserted and soldered to the printed circuit board or card. Unfortunately, copper and copper alloys have a tendency to react with various agents present in the air such as oxygen, water vapor, carbon dioxide, chlorine and sulfur. This, in turn, results in a decrease in the solderability of the copper-containing material over a period of time. In order to prevent corrosion of these copper containing surfaces and to preserve its solderability, various procedures have been suggested. For instance, it has been suggested to plate solder onto the copper-containing surface within a relatively short period of time after the bare circuit board or card has been completed. Although this method has been found effective in preserving the solderability of the circuit boards and cards, this is a time-consuming and costly procedure which also suffers from the deleterious effect of contributing to a short circuit on fine-line, high-density printed circuits Another common method employed to preserve solderability is the use of an immersion tin technique to protect the copper. However, this technique is relatively expensive and the tin is susceptible to corrosion by water vapor under relatively high humidity conditions.

In addition, there have been a number of suggestions for employing various azole materials to inhibit the corrosion of copper. For instance, U.S. Pat. Nos. 3,933,531; 4,134,959; 4,123,562; 4,373,656; 4,395,294; and 4,402,847 suggest various processes employing azoles for treating copper. However, treatments with azoles have not been entirely satisfactory since the extent of protection afforded has not been as good as the more expensive techniques such as the immersion tin technique.

The latest trends in the surface mount assembly processes have created the need for the use of compatible surface coatings for copper pads and plated-through holes (PTHs) which require protection from oxidation and corrosion until soldering operations are performed on the assembly line. These trends are: 1) Use of mixed (hybrid) technology; 2) Assemblies requiring multiple heat cycles, 3) Elimination of post-assembly cleaning operations; 4) Use of less active "no clean" and VOC-free pastes and fluxes; 5) High VO components (fine pitch); and 6) use of electrically-conductive adhesives in place of solders. To keep up with these transitions, the protective coatings used on copper surfaces must be replaced by material(s) which will satisfy all these demands and still be cost effective.

Benzotriazole and Hot Air Solder Levelling(HASL) are extensively used coatings in the electronic industry to protect copper surfaces and protect their solderability. However, benzotriazole cannot withstand multiple heat cycles and HASL, besides being expensive, produces thermal stresses in the card, resulting in warping or IP separation problems. HASL-treated cards also cannot maintain co-planarity of surfaces due to variations in the thickness and the crowning of the solder. The coating industry has responded to these problems by developing imidazole based coatings which can withstand multiple heat cycles, protecting the copper surface from oxidation. However, such coatings are thick (0.3 to 0.5 microns) and create problems in achieving a required degree of solderability or capillary action during wave soldering operations when used with less aggressive "no-clean" fluxes. Imidazole coatings may also create problems in the so-called "Bed of Nails" tests by forming a barrier to probes contacting the underlying copper surface or by coating the tips of the probes with insulative residues after repeated testing. Metallic coatings like immersion gold or palladium on the top of electroless nickel can overcome the insulating nature of thick organic coatings, but these are usually expensive due to the high precious metal costs and the slow plating processes. Rosin or resin-based coatings (prefluxes) will withstand multiple heat cycles but require solvent-cleanable solder pastes and fluxes, which are becoming outdated due to the drive for environmentally safe processes.

To meet the demands of advancing technology, it is clear that improved coatings and processes are needed which would combine the advantages of both organic and metallic coatings and optimize coating performance during the assembly of electronic components.

SUMMARY OF THE INVENTION

The present invention covers a process and coating composition to form an organic coating for copper and alloys thereof which is at least as effective in inhibiting corrosion as the azole coatings used in the prior art. The composite coating composition of the present invention comprises at least one organic corrosion-inhibiting compound selected from the group consisting of benzimidazole, alkylimidazoles, benzotriazoles and alkyltriazoles, substituted or unsubstituted, and metal particles composed of solder-wettable metals or metal solders including tin-lead solders. The composite coating composition can further comprise an organic or aqueous solvent and at least one oxygen-scavenging agent selected from the group consisting of acidic alkali metal bisulfites, acidic aromatic amines and ethylene glycol. The average size of the metal particles is comparable to the thickness of the coatings and is preferably in the range of from about 0.2 to 2 microns, or more preferably, 0.5–1 micron. The solder-wettable metals are selected from the group consisting of Pd, Sn, Ag, Au, Cu, Ni-coated Cu and Ni—Pd alloys. The metal solder may typically be a eutectic solder mixture containing about 62 percent tin and 38 percent lead or relatively close to eutectic solder containing about 60 percent tin and 40 percent lead. Sn Bi based solders and Ag-based solders can be used as alternatives to conventional Sn—Pb solders. In place of actual metal particles, the composition can include at least one metallic compound from the group consisting of metal acetates, acetylacetonates and carbonates which will yield particles of solder-wettable metal when heated.

The process of the present invention for coating a metal substrate containing copper or a copper alloy comprises steps of:

a) applying to said substrate a coating composition to said substrate comprising an organic corrosion-inhibiting compound selected from the group consisting of benzimidazoles, alkyl imidazoles, benzotriazoles and alkyltriazoles substituted or unsubstituted, and metal particles selected from the group consisting of solder-wettable metals and solders;

b) rinsing the coated surface with water; and c) drying the composition.

In such processes, the composition can be applied as a suspension of the metal particles in the organic compound or can include a metallic compound which yields particles of solder-wettable metal when heated. In the latter case, the coating may be heated to create the particles before storing the coated substrates, or the formation of the metal particles can be performed by the heat applied in soldering. Alternatively, the composition can be formed in situ by applying the metal particles and the organic compound separately, with either metal particles or organic compound applied first. The metal surfaces can be "seeded" with metal halides such as PdCI or SnCI, and will then attract metal particles when dipped in the organic compounds containing suspended metal particles.

In addition to the above steps (a), (b) and (c), the process preferably includes the preliminary steps of cleaning the substrate with a suitable cleaner followed by the steps of rinsing with water, microetching with an oxidizing agent such as alkali metal persulfates, deoxidizing with an acid such as sulfuric acid, rinsing again with water before drying. The substrate is preferably dipped in a solution such as benzotriazole prior to the final rinse.

The invention further provides metallic substrates comprising copper and a surface protective coating comprising:

a) an inner layer of copper complexed with an organic corrosion-inhibiting compound selected from the group consisting of benzimidazoles, alkylimidazoles, benzotriazoles and ethyltriazoles, substituted or unsubstituted, and b) an outer layer comprising the organic compound and metal particle from the group consisting of solder-wettable metals and solders.

The surface protective coating may be soldered in a conventional manner with heat, flux and solder at any time following formation of the coating. The presence of the metal particles in the coating absorbs heat from the solder and enhances the capillary flow of the solder. The metal particles may be formed as the organic coating breaks down thermally.

Typically, the process involves the protection of the copper-containing surfaces of circuit boards by applying a coating composition comprising an organic corrosion-inhibiting compound selected from benzimidazoles, alkylimidazoles, benzotriazoles and alkyltriazoles and metal particles selected from the group consisting of solder-wettable metals and solders.

BRIEF DESCRIPTION OF THE DRAWINGS

FIG. 1 illustrates a conductive copper pad coated with a conventional organic coating.

FIG. 2 illustrates the reflow mechanism for surface mount technology (SMT) soldering of the organic-coated pad of FIG. 1.

FIG. 5 illustrates a conventional plated-through hole (PTH) in which the copper surface is covered with a conventional organic coating.

FIG. 6 illustrates the mechanism of wave soldering of a pin inserted in the plated-through hole of FIG. 5.

DETAILED DESCRIPTION OF THE INVENTION

Figure 3:
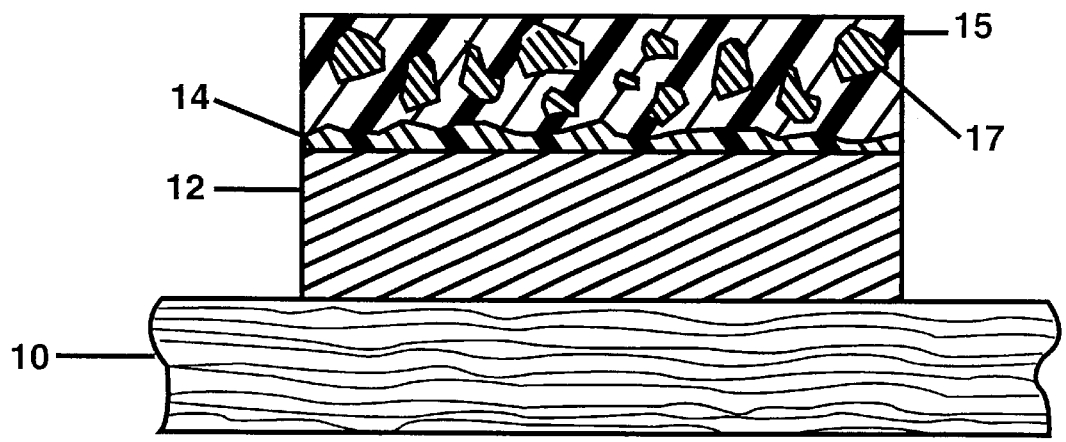
FIG. 3 illustrates the copper pad of FIG. 1 coated with an organometallic coating in accordance with the invention.

The surfaces to be protected from corrosion in accordance with the present invention are copper and copper alloy surfaces such as are commonly employed in the fabrication of electronic components.

The organic corrosion-inhibiting compound can be at least one benzimidazole, alkylimidazole, benzotriazole or alkyltriazole, as discussed below. These compounds can be in unsubstituted form or substituted with common substituents such as lower alkyl, halo or nitro groups.

The benzimidazoles are represented by general formula (I):

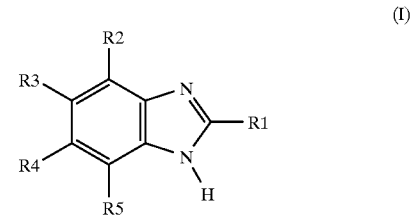

(I)

wherein R1 represents an alkyl group or hydrogen and R2, R3, R4 and R5 each represent a lower alkyl group, a halogen atom, a nitro group or a hydrogen atom. Specific examples include benzimidazole, 2-methylbenzimidazole, 5-methylbenzimidazole, 5,6-dimethylbenzimidazole, 2-propyl-4,5-dimethylbenzimidazole, 2-butyl-5-nitrobenzimidazole, 2-pentyl-5,6 dichlorobenzimidazole, and 2-heptadecyl-5-methylbenzimidazole.

The benzotriazoles are represented by the general formula (II):

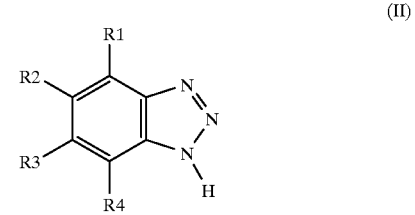

(II)

wherein R1, R2, R3 and R4 represent the same substituents as for R2 to R5 of formula (I). Specific examples include 1-methylbenzotriazole and 5-methylbenzotriazole.

The alkylimidazoles are represented by general formula (III):

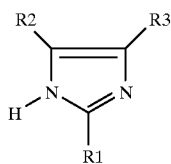

wherein R1 is an alkyl group containing from 2 to about 5 carbon atoms and R2 and R3 can be the same as R2 to R5 of formula (I). Specific examples include 2-amylimidazole, 2-heptylimidazole, 2-decylimidazole, 2-undecyl, imidazole, 2-dodecylimidazole, 2-tridecylimidazole, 2-tetradecylimidazole, 2-heptadecylimidazole, 2-undecyl-4-methylimidazole and 2-heptadecyl-4 methylimidazole.

The alkyltriazoles are represented by general formula (IV):

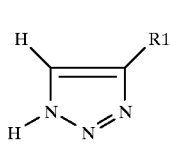

wherein R1 is an alkyl group containing from 1 to about 6 carbon atoms. Specific examples include alkyltriazoles where R1 is methyl or ethyl.

The coating composition can contain a suitable organic or aqueous solvent to dissolve the organic compound and provide the desired viscosity, preferably ranging from about 1 to about 100 cp. Any suitable solvent can be used which will dissolve the organic compound. However, when long chain alkyl groups are included in the compound, water alone may not dissolve the compound, and either organic solvents or water containing organic solvents should be used. Suitable organic solvents include lower alcohols, glycolketones, aromatic and aliphatic hydrocarbon and halocarbons. The preferred organic solvents usable in the present invention include, but are not limited to, methanol, ethanol, 1-propanol, 2-propanol, ethylene glycol, propylene glycol, acetone, acetonitrile, dioxane, pyridine, lutidine, benzene, toluene, n-hexane, trichlorethylene and carbon tetrachloride.

The theory of the protective effects of the coating is not entirely clear, but they may be based upon the following mechanism which was proposed in U.S. Pat. No. 3,933,531 (in colt 2). The surface of the copper or copper alloy may react with an —HN— group of the imidazole (or triazole) ring and some type of bond is formed between the copper atoms and imidazole molecules. The —NH— group would appear to act as an anchor. The hydrogen atom generated by the reaction can be adsorbed onto the copper metal in the form of adsorption hydrogen. Then, an —NH— group of another imidazole molecule can become associated with the tertiary nitrogen of the imidazole bonded to the copper surface, and these tertiary nitrogens and —NH— groups are held together by hydrogen bonding. Such hydrogen bonding can also be assisted by the formation of micelles of the alkyl groups, when present. Thus, once the imidazoles have been deposited or adhered to the copper surface, additional imidazole molecules are gradually attracted one by one to the adhered imidazole molecules by hydrogen bonding and possibly micelle formation, and the copper surface becomes coated with a thin layer of imidazoles. The mechanism may alternatively be explained as the formation of $Cu^+$ ions at the surface of the substrate, which ions react with adsorbed benzimidazole molecules to form a three-dimensional but thin Cu(I)-benzimidazole complex at the Cu surface. In any case, the film is adherent to the substrate, insoluble in water or alcohol and about 1 to 5 rim thick.

In contrast, it is believed that the bulk of the coating, which contains the metal particles, does not adhere to the copper, but merely provides a protective coating over the inner layer, as discussed in detail below. Its thickness is proportional to the size of the suspended metal particles.

The composition can optionally further comprise at least one oxygen scavenging agent selected from the group consisting of acidic alkali metal bisulfites, acidic aromatic amines and ethylene glycol.

The metal particles are selected from solder-wettable metals and metal solders. By "solder-wettable", it is meant that when exposed to molten solder, the particles surfaces are covered more or less uniformly with the solder without the particles themselves melting. In contrast, the particles of solder tend to be absorbed into the molten solder itself. Such solder wettable metals include, but are not limited to, Pd, Sn, Ag, Au, Cu, Ni-plated Cu and Ni—Pd alloys. The tin-lead solders can comprise from about 3 to about 90 weight percent tin and from about 10 to about 97 weight percent lead, but preferably are the eutectic mixture of about 62 percent tin and 38 percent lead. Sn-Bi and Ag-based solders can also be employed. The average size of the particles should be comparable to the thickness of the outer coating to be formed, generally from about 0.2 to 2 microns, and preferably from about 0.5 to 1 micron.

The metal particles can be thermally formed in situ in the coating composition and/or the coatings, extending even to the application of heat for soldering components to the copper, by employing metallic or organometallic compounds which form solder-wettable elemental metals upon heating. Such particles are formed in a uniform shape and have an average size in the range of from about 0.2 to about 2 microns. Such compounds include noble metal acetates, acetylacetonates and carbonates. Specific compounds include, but are not limited to, palladium acetate, silver acetylacetonate and silver carbonate.

The essential steps of the coating process are the application of the coating composition containing the organic compound and metal particles, followed by rinsing with water to remove excess coating material and drying. Before coating, however, the copper surface is preferably prepared by cleaning with at least one suitable cleaner to remove organic contamination and light oxidation of the copper. Suitable cleaners include sodium persulfate solutions, inorganic acid compositions such as hydrochloric acid and basic pretreatments such as sodium bicarbonate and sodium carbonate. Proprietary cleaners such as "Cutek HL41" and "Accuclean" (Enthone, Inc.) can also be used. The commercial "Entek" process of Enthone OMI Inc. can be used. After cleaning with the proprietary cleaner Entek Cleaner SC-1O1DE to make the copper surface more wettable, and rinsing with water, the substrate is immersed in Entek Microetch ME-1020 to roughen the copper surface. After another rinse, the substrate is dipped into sulfuric acid to remove oxides, rinsed, dipped into an Entek Cu-56 solution containing benzotriazole, rinsed and dried. After such cleaning, the surface should be rinsed in water. The surface should then be roughened by microetching by an oxidizing agent such as sodium persulfate. The surface is then deoxidized by dipping in an inorganic acid such as sulfuric acid. The substrate is preferably then dipped in a solution containing a compound such as benzotriazole (ENTEK Cu-56 solution, from Enthone Inc.) Finally, the surface should be rinsed in water and blow dried to remove moisture.

The coating composition can be applied by any suitable means which will allow the copper-organic complex to form on the surface and a uniform coating of organic material containing a dispersion of solder-wettable metal particles to form thereon. The surface may be coated with a dispersion of the metal particles in the organic compound by various means including dipping, brushing and spraying. Alternatively, as described above, a solution of the organic compound and a metallic or an organometallic compound which will form metal particles upon heating can be applied to the surface in the same manner. At a suitable time, the coated substrate can be heated to form the metal particles, or the metal particles can be formed locally in situ when heat is applied to solder components to the substrate.

The metal particles and organic compound may be applied separately, with the metal particles being seeded on the substrate surface either first or after the application of a coat of the organic compound. The metal particles can be applied by any suitable means such as brushing or spraying, but are preferably applied by electrostatic spraying to ensure adherence and minimize loss. The metal particles can be kept dispersed in the organic compound solution by any suitable means, including ultrasonic agitation.

The following non-limiting hypothetical examples are presented to further illustrate the present invention.

HYPOTHETICAL AND COMPARATIVE EXAMPLES

EXAMPLE A SMT SOLDERING

Figure 4:
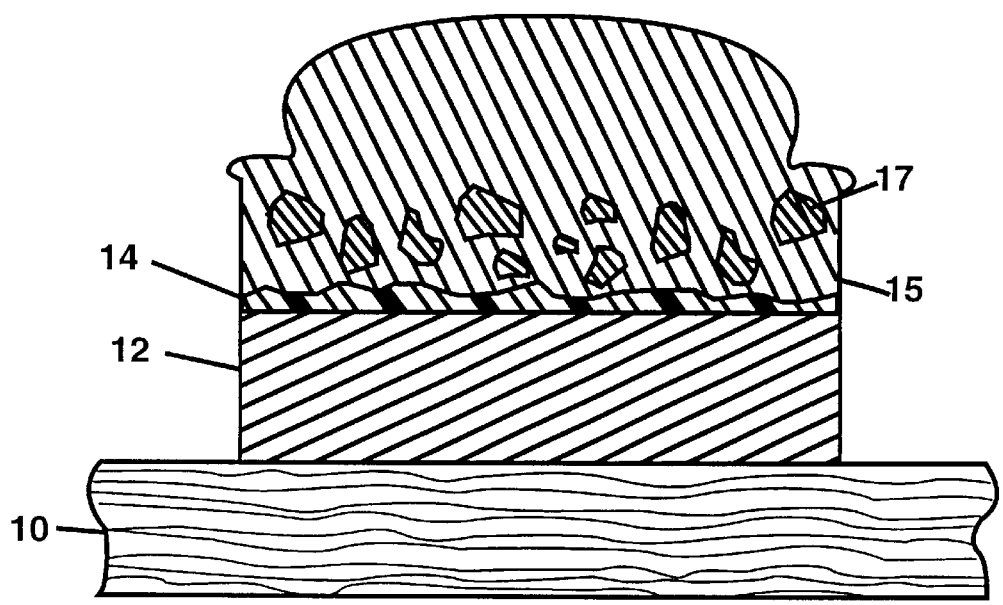
FIG. 4 illustrates the reflow mechanism for SMT soldering of the organometallic-coated pad of FIG. 3.

FIG. 1 illustrates a printed circuit board laminate (10) (such as "FR4") including a copper pad (12). A conventional organic coating of benzimidazole or the like has been applied, resulting in a thin surface coating of copper-organic complex (14) and a thicker surface coating of organic material (16). As illustrated in FIG. 2, when solder paste (18) is applied and heated, the solder must penetrate the full thickness of the organic coating to reach the copper surface. FIG. 3 illustrates a similar circuit board (10) and copper pad (12) coated with an organometallic coating of the present invention. The same thin layer of copper-organic complex (14) forms on the metal surface, but the thicker outer layer (15) contains dispersed metal particles (17). Thus, when solder paste (18) is applied and heated as illustrated in FIG. 4, the molten solder easily wets and flows between the dispersed metal particles as the organic material decomposes and bonds to them, aided by capillary action in reaching the copper surface.

EXAMPLE B WAVE SOLDERING OF PLATED-THROUGH HOLES

Figure 7:
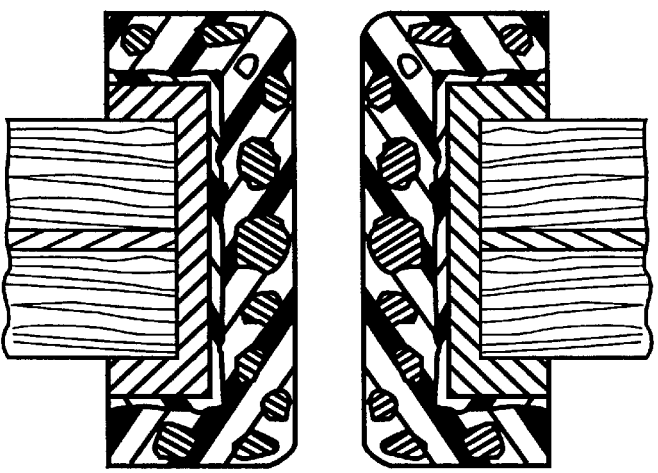
FIG. 7 illustrates a plated-through hole in which the copper surface is covered with an organometallic coating in accordance with the invention.
Figure 8:
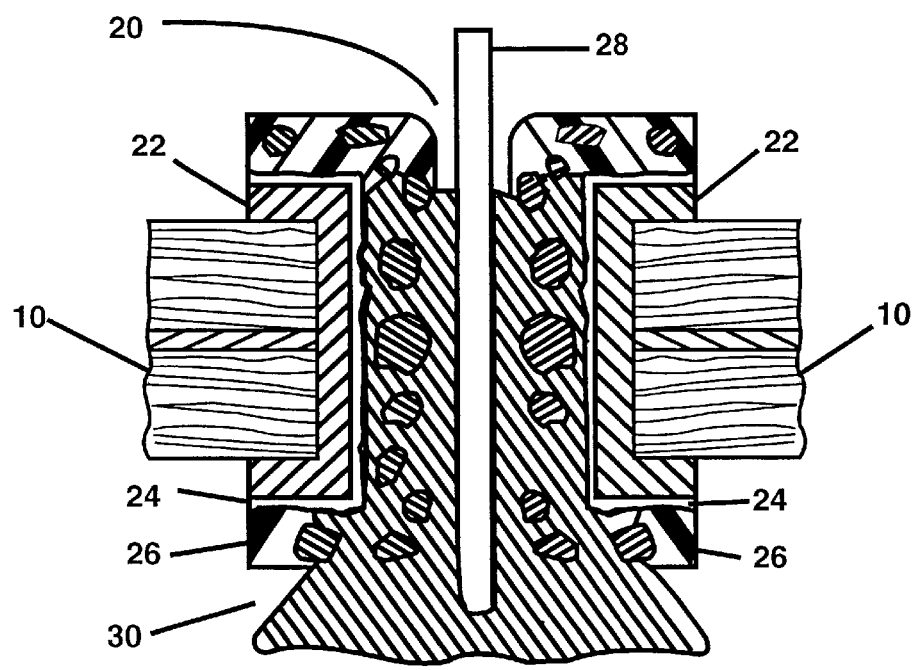
FIG. 8 illustrates the mechanism of wave soldering of a pin inserted in the plated-through hole of FIG. 7, in which the copper surface is coated with an organometallic coating in accordance with the invention.

FIG. 5 illustrates a plated through hole (20) in a circuit board (10). Copper layers (22) cover the edges of the circuit board inside the hole, and the inside of the hole has been coated with a conventional organic coating which forms a copper-organic complex layer (24) and a thicker layer of organic material (26). In FIG. 6, when a metal pin (28) is inserted into the hole of FIG. 5 and a solder wave (30) is introduced from below to solder the pin into the hole, problems are encountered because the solder must penetrate the organic layer to reach the copper surface and the solder wave is prevented from penetrating very far into the space between the surface of the hole and the pin, apparently due to surface tension. FIG. 7 illustrates a similar plated-through hole (20) in a circuit board (10) which is coated with the organometallic coating (32) of the invention, containing metal particles (34). In FIG. 8, when a solder wave (30) is contacted from below, the solder easily penetrates to the copper surface by binding to the metal particles and passing between them and the pin (28) by capillary action. The result is a quicker process of soldering which provides a superior solder joint between the pin and the plated-through hole in the circuit board.

We claim:

1. A coating composition for copper-containing metals comprising at least one organic corrosion-inhibiting compound selected from the group consisting of benzimidazoles, alkylimidazoles, benzotriazoles, alkyltriazoles, and metal particles selected from the group consisting of comprising solder-wettable metals or metal solders, and an oxygen-scavenging agent selected from the group consisting of acidic alkali metal bisulfites, acidic aromatic amines and ethylene glycol.

2. The coating composition of claim 1 which further comprises at least one solvent selected from the group consisting of lower alcohols of 1 to 6 carbon atoms, glycols, ketones, aromatic hydrocarbons and water.

3. The coating composition of claim 1, wherein the average size lies in the range of from about 0.5 to about 1 micron.

4. The coating composition of claim 1, wherein said solder-wettable metal is selected from the group consisting of Pd, Sn, Ag, Au, Cu, Ni-plated Cu and Ni—Pd alloys.

5. The coating composition of claim 2 wherein the viscosity of said coating composition is in the range of from about 1 to about 100 cp.

6. The composition of claim 1 which further comprises at least one organometallic compound which will yield particles of solder-wettable metal when heated.

7. The composition of claim 6 wherein said metallic compound is selected from the group consisting of noble metal acetates, noble metal acetylacetonates and noble metal carbonates.

8. A process of coating a metal substrate containing copper or a copper alloy comprising steps of:
   a) applying to said substrate a coating composition comprising an organic compound selected from the group consisting of benzimidazoles, alkylimidazoles, benzotriazoles, alkyltriazoles and metal particles selected from the group consisting of solder-wettable metals and metal solders,
   b) rinsing the coated surface with water, and
   c) drying;
   wherein said composition is applied by first applying a solution of said organic compound and at least one metallic compound selected from the group consisting of noble metal acetates, noble metal acetylacetonates and noble metal carbonates, then heating said solution in situ to form noble metal particles.

9. A process of coating a metal substrate containing copper or a copper alloy comprising steps of:
   a) applying to said substrate a coating composition comprising an organic compound selected from the group consisting of benzimidazoles, alkylimidazoles, benzotriazoles, alkyltriazoles and metal particles selected from the group consisting of solder-wettable metals and metal solders,
   b) rinsing the coated surface with water, and
   c) drying;
   further comprising preliminary steps of cleaning said substrate with a suitable cleaner, rinsing with water, microetching with an oxidizing agent, deoxidizing, rinsing with water and drying.

10. A process of coating a metal substrate containing copper or a copper alloy comprising steps of:
   a) applying to said substrate a coating composition comprising an organic compound selected from the group consisting of benzimidazoles, alkylimidazoles, benzotriazoles, alkyltriazoles and metal particles selected from the group consisting of solder-wettable metals and metal solders,
   b) rinsing the coated surface with water, and
   c) drying;
   wherein said composition is applied by first applying said metal particles to said substrate, then applying said organic compound thereon.

11. A process of coating a metal substrate containing copper or a copper alloy comprising steps of:
   a) applying to said substrate a coating composition comprising an organic compound selected from the group consisting of benzimidazoles, alkylimidazoles, benzotriazoles, alkyltriazoles and metal particles selected from the group consisting of solder-wettable metals and metal solders,
   b) rinsing the coated surface with water, and
   c) drying;
   wherein said composition is applied as a suspension of said metal particles in said organic compound.

12. The process of claim 11 wherein said composition is applied as a suspension of said metal particles in said organic compound.

13. A metallic substrate comprising copper with at least one surface protected by:
   a) an inner layer of copper complexed with an organic corrosion-inhibiting compound selected from the group consisting of benzimidazoles, alkylimidazoles, benzotriazoles, alkyltriazoles, and
   b) an outer layer comprising said organic compound, metal particles selected from the group consisting of solder-wettable metals and metal solders, and an oxygen-scavenging agent selected from the group consisting of acidic alkali metal bisulfites, acidic aromatic amines and ethylene glycol.

14. A process of soldering metallic components to the coated metallic substrate of claim 13 by applying heat, flux and solder.

15. A process of protecting the copper surfaces of circuit boards by applying a coating composition comprising an organic compound selected from the group consisting of benzimidazoles, alkylimidazoles, benzotriazoles, alkyltriazoles and metal particles selected from the group consisting of solder-wettable metals and tin-lead solders wherein the average size of the metal particles lies in the range of about 0.2 to 2.0 microns and wherein said composition is applied by first applying said metal particles to said substrate, then applying said organic compound thereon.

* * * * *